United States Patent
Kiku et al.

(10) Patent No.: US 7,261,780 B2
(45) Date of Patent: Aug. 28, 2007

(54) CERAMIC SUSCEPTOR AND A METHOD OF CLEANING THE SAME

(75) Inventors: Taiji Kiku, Handa (JP); Akiyoshi Hattori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/087,094

(22) Filed: Mar. 22, 2005

(65) Prior Publication Data
US 2005/0211703 A1  Sep. 29, 2005

(30) Foreign Application Priority Data
Mar. 23, 2004  (JP) .......................... P2004-084253

(51) Int. Cl.
*B08B 3/04* (2006.01)
(52) U.S. Cl. ............... 134/26; 134/2; 134/3; 134/6; 134/7; 134/28; 134/36; 134/41; 134/42; 134/902
(58) Field of Classification Search ............ 134/2, 134/6, 7, 3, 26, 28, 36, 41, 42, 902
See application file for complete search history.

(56) References Cited

U.S. PATENT DOCUMENTS

| | | | |
|---|---|---|---|
| 5,498,293 A * | 3/1996 | Ilardi et al. ............. | 134/3 |
| 5,837,662 A | 11/1998 | Chai et al. | |
| 5,885,362 A * | 3/1999 | Morinaga et al. ........ | 134/2 |
| 5,895,781 A * | 4/1999 | Neumiller et al. ....... | 510/238 |
| 5,981,449 A * | 11/1999 | Rapisarda et al. ....... | 510/108 |
| 6,423,148 B1 * | 7/2002 | Aoki ...................... | 134/3 |
| 6,498,131 B1 * | 12/2002 | Small et al. ............. | 510/175 |
| 6,565,667 B2 * | 5/2003 | Haerle et al. ............ | 134/7 |
| 2001/0020478 A1 * | 9/2001 | Kojima et al. ........... | 134/3 |
| 2003/0080333 A1 * | 5/2003 | Yamaguchi et al. ..... | 257/40 |
| 2004/0099290 A1 * | 5/2004 | Morinaga et al. ........ | 134/27 |
| 2005/0181617 A1 | 8/2005 | Bosch | |
| 2005/0211703 A1 * | 9/2005 | Kiku et al. .............. | 219/730 |

FOREIGN PATENT DOCUMENTS

JP  2003-136027  5/2003

OTHER PUBLICATIONS

U.S. Appl. No. 11/032,939, filed Jan. 11, 2005, Yamaguchi et al.

* cited by examiner

*Primary Examiner*—Sharidan Carrillo
(74) *Attorney, Agent, or Firm*—Burr & Brown

(57) ABSTRACT

An object of the present invention is to provide a ceramic susceptor for considerably reducing the count number of metal atoms on the surface of a semiconductor after the semiconductor is treated, specifically to $1 \times 10^{10}$ atoms/cm$^2$ or lower. It is provided a ceramic susceptor 2 having a face for mounting semiconductor 2a wherein each of metal elements other than metal element(s) constituting the ceramic material has a count number of $1 \times 10^{11}$ atoms/cm$^2$ or lower. It is further provided a method of cleaning a ceramic susceptor 2 having a face 2a for mounting semiconductor, wherein the susceptor is cleaned using a complexing agent capable of forming a complex with a metal element.

4 Claims, 1 Drawing Sheet

CERAMIC SUSCEPTOR AND A METHOD OF CLEANING THE SAME

This application claims the benefit of a Japanese Patent Application P2004-84253 filed on Mar. 23, 2004, the entirety of which is incorporated by reference.

FIELD OF THE INVENTION

This invention relates to a ceramic susceptor and a method of cleaning the same.

RELATED ART STATEMENT

Recently, an electrostatic chuck has been used for adsorbing and supporting a semiconductor wafer in various processes such as conveying of a wafer, exposure, fine working, cleaning, etching, dicing and film forming such as sputtering and CVD. A ceramic heater for heating a semiconductor wafer and an electrode device for generating high frequency have been also commercialized.

Recently, a finer wiring rule for a semiconductor has been applied. For example, a fine wiring according to a wiring rule of not larger than 0.13 μm has been applied. Such finer wiring rule may present a problem of a low level metal contamination, which has not been considered problematic in conventional wiring rules. That is, when a silicon wafer is mounted on a ceramic member and heated at a high temperature, for example, of not lower than 500° C., a trace amount of metal atoms present in the surface region of the ceramic member may be transferred and diffused into the silicon wafer. Such diffusion of the metal atoms may induce semiconductor defects and results in off-specification products.

It has been known to subject a ceramic member to ultrasonic cleaning using an organic solvent and purified water for preventing the metal contamination of the silicon wafer mounted on the member.

However, as the wiring rule becomes finer, it is demanded to considerably reduce the metal contamination of the back side of a silicon wafer. For example, it is demanded to reduce the count number of metal atoms diffused into the wafer at a value of $1 \times 10^{10}$ atoms/cm² or lower for a 12-inched wafer.

To cope with this problem, the applicant disclosed, in Japanese Patent publication 2003-136,027 (U.S. patent application Ser. No. 10/271,002; U.S. Patent Publication 2003-0080333A1), that a ceramic susceptor is subjected to blasting and then washed with an organic acid or a weak acid.

SUMMARY OF THE INVENTION

It is proved that the amount of metal contamination is $1 \times 10^{14}$ atoms/cm² for Fe in a ceramic heater on the surface cleaned with pure water. It is further proved that a metal amount diffused into a silicon wafer exceeds $1 \times 10^{12}$ atoms/cm² when the ceramic heater is used at a high temperature (500° C. or higher).

Further, according to the method disclosed in Japanese Patent publication 2003-136,027 (U.S. patent application Ser. No. 10/271,002), a count number of metal atoms on the surface of a ceramic susceptor can be successfully and considerably reduced. It is proved that, however, a count number of metal atoms transferred to the surface of a silicon wafer exceeds $1 \times 10^{10}$ atoms/cm². It has not been studied the transfer of metal atoms from a ceramic susceptor with such trace amount of metal contamination to a silicon wafer at a high temperature. Further, it has not been proposed a cleaning technique for reducing the count number of metal atoms on the surface of a ceramic susceptor to such a high degree.

An object of the present invention is to provide a ceramic susceptor for considerably reducing the count number of metal atoms on the surface of a semiconductor after the semiconductor is treated, specifically to $1 \times 10^{10}$ atoms/cm² or lower.

Another object of the present invention is to provide a cleaning method for considerably reducing the count number of metal atoms on the surface of a ceramic susceptor.

The present invention provides a susceptor made of a ceramic material comprising a face for mounting semiconductor; wherein each of metal elements other than metal element or elements constituting the ceramic material has a count number of $1 \times 10^{11}$ atoms/cm² or lower.

The present invention further provides a method of cleaning a ceramic susceptor comprising a face for mounting semiconductor: the method comprising the step of;

cleaning said susceptor using a complexing agent capable of forming a complex with a metal element.

The present invention still further provides a ceramic susceptor obtained by the method.

The present inventors have tried to use a complexing agent, such as ethylenediaminetetraacetic acid (EDTA), capable of forming a complex with a metal element and preventing readhesion of the metal atoms in a cleaning process of a ceramic susceptor. A count number of metal atoms on the surface of a ceramic susceptor can be thereby successfully and considerably reduced to $1 \times 10^{11}$ atoms/cm² or lower. Such low level of count number of metal atoms has not been attained in prior arts.

Further, the present inventors have tried to mount a silicon wafer on such ceramic susceptor, heat at a high temperature and then measure an amount of metal atoms transferred to a silicon wafer. It is thus found that an amount of metal atoms transferred to a silicon wafer can be considerably reduced to $1 \times 10^{10}$ atoms/cm² or lower. The present invention is based on the findings.

In prior arts, the count number of transferred metal atoms onto a silicon wafer has been considerably higher than $1 \times 10^{10}$ atoms/cm² or lower, which is demanded in the finer specification of manufacturing of semiconductors. It has not been studied relationship between the count number of metal atoms on the mounting face of a ceramic susceptor and the count number of metal atoms transferred onto a silicon wafer after the silicon wafer is heated on the susceptor, both of the count numbers being of extremely low levels.

These and other objects, features and advantages of the invention will be appreciated upon reading the following description of the invention when taken in conjunction with the attached drawings, with the understanding that some modifications, variations and changes of the same could be made by the skilled person in the art.

PREFERRED EMBODIMENTS OF THE INVENTION

Figure 1:
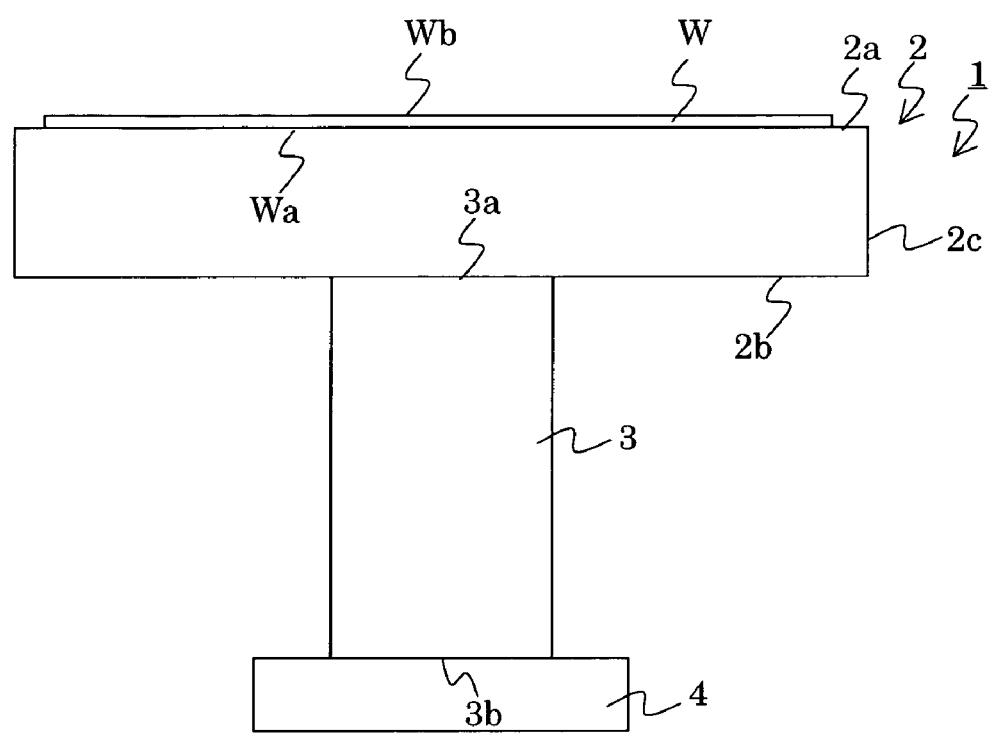
FIG. 1 is a front view schematically showing a semiconductor "W" mounted on a ceramic susceptor 2.

FIG. 1 is a schematic view of a semiconductor mounting device 1 with a semiconductor wafer "W" mounted thereon. The device 1 has a ceramic susceptor 2, a cylindrical holder 3 supporting the susceptor 2, and a basement 4. An end face 3a of the holder 3 is connected to a back face 2b of the susceptor 2. The other end face 3b of the holder 3 is connected to the basement 4. The semiconductor wafer "W" is mounted on a semiconductor mounting surface 2a of the susceptor 2. 2c represents a side face of the susceptor 2. For example, a resistance heat generator or an electrostatic chuck electrode may be buried in the susceptor 2.

With the semiconductor wafer W mounted on the semiconductor mounting surface 2a, the semiconductor wafer W is heated at a temperature higher than 500° C., for example. Metal atoms may be diffused from the semiconductor mounting surface 2a of the susceptor 2 to the surface region "Wa" of the semiconductor wafer W. According to the present invention, such transfer and diffusion of the metal atoms can be prevented.

According to the present invention, the kind of the ceramic susceptor having a semiconductor mounting face is not particularly limited. The present invention may be applied to any system for producing a semiconductor, which means a system usable in a wide variety of semiconductor processing in which metal contamination of a semiconductor is to be avoided. Such system includes a film forming, etching, cleaning and testing systems.

The ceramic susceptor includes an electrostatic chuck, vacuum chuck, an article having a ceramic substrate and an electrode for generating high frequency plasma embedded in the substrate, and a heater.

The ceramic material of the susceptor is not restricted. For further reducing contamination of a semiconductor, an aluminum nitride base ceramics, a composite material containing aluminum nitride, an alumina base ceramics, a composite material containing alumina, and a composite ceramics composed of alumina and aluminum nitride are preferred.

According to the invention, each of count numbers of metal atoms other than metal atom(s) constituting the ceramic material for the susceptor is $1 \times 10^{11}$ atoms/cm$^2$ or lower, on the mounting face for semiconductor. "Metal element(s) constituting the ceramic material" means metal atom(s) constituting the ceramic compound as the essential constituent. Specifically, aluminum is the metal atom constituting the ceramic material such as aluminum nitride or alumina.

It is required that each of count numbers of metal atoms other than metal atom(s) constituting the ceramic material for the susceptor is $1 \times 10^{11}$ atoms/cm$^2$ or lower, on the mounting face for semiconductor. Such metal atoms belong to elements of Ia to VIIa, VIII, Ib and IIb in the periodic table, as well as a part of elements of IIIb and IVb in the periodic table (such as Si, Ga and Ge).

Each of the count numbers of the metal elements on the semiconductor mounting face of the susceptor can be measured by ICP-MS method (inductive coupling plasma-mass spectrometry). Each of the count numbers of the metal elements on the surface of a semiconductor is measured by TXRF method (total reflection fluorescent X-ray spectroscopy), as described later.

Further, according to the present invention, a ceramic susceptor is cleaned with a complexing agent capable of forming a complex with a metal element. Such metal element to be bonded with the complexing agent may preferably be copper and/or iron causing considerable metal contamination of semiconductor. It is possible to reduce the amounts of copper and iron to an extremely low trace amount.

Such complexing agent is not particularly limited, and includes ethylenediaminetetraacetic acid.

Further, when a ceramic susceptor is cleaned with a complexing agent, an organic acid and/or weak acid may be mixed with the complexing agent to further improve the efficiency of cleaning.

The organic acid used in the present invention includes the followings.
(1) Carboxylic acids
  (Mono-substituted carboxylic acids)
  Aliphatic carboxylic acids such as acetic acid, acrylic acid and propionic acid
  Aromatic carboxylic acids such as benzoic acid, phthalic acid, isophthalic acid and terephthalic acid
  (Di-substituted carboxylic acids)
  Aliphatic carboxylic acids such as oxalic acid, glutaric acid, adipic acid, malonic acid, succinic acid, maleic acid, fumaric acid and tartaric acid
  Aromatic carboxylic acids such as nicotinic acid
  (Multi-substituted carboxylic acids)
  Citric acid, etc.
(2) Organic compounds having phenolic hydroxyl groups
(3) Aliphatic amines The weak acid usable in the invention may preferably have a dissociation constant in water of 5 or lower. The weak acids can be exemplified as follows.
  (a) Carboxylic acids (1) described above
  (b) Aromatic amines According to a preferred embodiment, a ceramic susceptor may be subjected to blasting treatment, followed by the cleaning with a complexing agent.

The blasting treatment includes the following process.

(Sandblast)

A blasting material for sandblasting may preferably be a ceramic material such as silicon carbide or alumina. Metals are not preferable because they can be a source of metal contamination. The particle diameter of the blast material may preferably be #180 or finer, for reducing damage caused on the surface of the ceramic member and the content of residual metal components on the damaged area. The blast nozzle material may preferably be a ceramics. Wet and dry processes are both available.

EXAMPLES (Measuring Procedure)

A ceramic heater with a planar shape was manufactured. Specifically, aluminum nitride powder obtained by a reduction nitriding process was used. An acrylic resin binder was added therein, and then the mixture was granulated by a spray dryer to obtain granulated grains. Three sheets of molded bodies were sequentially made by uniaxial press-molding of the granulated grains. The three layers of molded bodies were then stacked to provide a single press-molded body. A coil-like resistance heat generator made of molybdenum was buried in the press-molded body.

The molded body was placed in a hot press mold, which was then hermetically sealed. When the molded body was heated, the pressure was reduced in a temperature range from room temperature to 1000° C. The maximum temperature was 1800° C. and the molded body was held and fired at the maximum temperature under 200 kgf/cm$^2$ for four hours in nitrogen gas to obtain a sintered body. The sintered body was then subjected to machine working and finishing to produce a heater. The diameter and thickness of the heater 2 were 330 mm and 15 mm, respectively. The semiconductor mounting face was then cleaned according to each of the procedures described below.

The heater 2 was then furnished as shown in FIG. 1, and the mirror finished surface of 12-inched silicon wafer was mounted on the semiconductor mounting surface 2a of the heater 2. Electric power was then supplied to the resistance heat generators and the average temperature on the semiconductor mounting surface 2a of the heater 2 was set to about 600° C. The pressure in the chamber was set to $1\times10^{-3}$ Torr. The temperature was kept at 600° C. for 20 min, subsequently the temperature was lowered and the silicon wafer was detached from the heater 2.

The amount of metal elements diffused in the 12-inch silicon wafer was then measured by TXRF method. That is, fine droplets are dropped onto the silicon wafer and X-ray is irradiated onto the silicon wafer under total reflection condition to detect the thus reflected fluorescent X-ray. The wavelength of the reflected fluorescent X-ray is used to detect the kind and content of each metal element.

The surface of the semiconductor mounting face of the heater was cleaned according to each of the procedures described in the experiments described below. At the same time, a test piece having a length of 50 mm, width of 50 mm and thickness of 4 mm was cleaned by the same procedure and the amounts of metal elements on the surfaces were measured using ICP-MS method. That is, the mounting face of the heater was treated with 1 cm$^3$ of mixed acids of hydrofluoric acid and hydroxyl peroxide. The thus obtained sample solution was taken and evaporated to obtain dry residue. The residue was dissolved in hydrogen fluoride water and sprayed onto a system for ICP-MS (Inductive coupling plasma-mass spectroscopy). The thus sprayed solution was ionized by plasma in the spectrometer. Excessive elements were removed by passing the ions through an ionic lens. Direction of the ions was then bent at 90 degree in the smaller order of the mass numbers of elements by + and − electrodes of quadplex polar electrode system. By this procedure, the count numbers of ions can be detected for each mass number.

(Experiment 1)

The wafer mounting face of the ceramic heater was subjected to blasting, washed with hydrochloric acid and then with aqueous solution of oxalic acid. The concentration of oxalic acid was 1 N and the washing was performed for 10 minutes.

As a result, the count numbers of Fe and Cu of the test piece were $1.5\times10^{12}$ atoms/cm$^2$ and $7.0\times10^{11}$ atoms/cm$^2$, respectively. Each of metal elements other than aluminum, Fe and Cu was proved to be not higher than $1.0\times10^{10}$ atoms/cm$^2$.

The count numbers of Fe and Cu of the silicon wafer were proved to be $9.5\times10^{10}$ atoms/cm$^2$ and $8.0\times10^{10}$ atoms/cm$^2$, respectively.

(Experiment 2)

The wafer mounting face of the ceramic heater was subjected to blasting, washed with hydrochloric acid and then with aqueous solution of oxalic acid. The concentration of oxalic acid was 1 N and the washing was performed for 10 minutes at 50° C.

As a result, the count numbers of Fe and Cu of the test piece were $4.5\times10^{11}$ atoms/cm$^2$ and $5.0\times10^{10}$ atoms/cm$^2$, respectively. Each of metal elements other than aluminum, Fe and Cu was proved to be not higher than $1.0\times10^{10}$ atoms/cm$^2$.

The count numbers of Fe and Cu of the silicon wafer were proved to be $5.5\times10^{10}$ atoms/cm$^2$ and $2.0\times10^{10}$ atoms/cm$^2$, respectively.

(Experiment 3)

The wafer mounting face of the ceramic heater was subjected to blasting, and washed with aqueous solution of oxalic acid and ethylenediaminetetraacetic acid (EDTA). The concentrations of oxalic acid and EDTA were 1 N and 0.1%, respectively. The washing was performed for 10 minutes at 50° C.

As a result, the count numbers of Fe and Cu of the test piece were $1.5\times10^{11}$ atoms/cm$^2$ and $8.0\times10^{10}$ atoms/cm$^2$, respectively. Each of metal elements other than aluminum, Fe and Cu was proved to be not higher than $1.0\times10^{10}$ atoms/cm$^2$.

The count numbers of Fe and Cu of the silicon wafer were proved to be $1.5\times10^{10}$ atoms/cm$^2$ and $1.0\times10^{10}$ atoms/cm$^2$, respectively.

As described above, the count numbers of metal elements on the test piece can be considerably reduced, compared with the experiments 1 and 2.

(Experiment 4)

The wafer mounting face of the ceramic heater was subjected to blasting, and washed with aqueous solution of oxalic acid and ethylenediaminetetraacetic acid (EDTA). The concentrations of oxalic acid and EDTA were 1 N and 0.1%, respectively. The washing was performed for 10 minutes at 50° C. and repeated twice.

As a result, the count numbers of Fe and Cu of the test piece were $7.5\times10^{10}$ atoms/cm$^2$ and $5.0\times10^{10}$ atoms/cm$^2$, respectively. Each of metal elements other than aluminum, Fe and Cu was proved to be not higher than $1.0\times10^{10}$ atoms/cm$^2$.

The count numbers of Fe and Cu of the silicon wafer were proved to be $5.0\times10^9$ atoms/cm$^2$ and $3.0\times10^9$ atoms/cm$^2$, respectively.

As described above, the count numbers of metal elements on the test piece can be considerably reduced, compared with the experiments 1 and 2. Further, it is proved that the count numbers of metal elements on the silicon wafer can be reduced to a value of $1.0\times10^{10}$ atoms/cm$^2$ or lower, by reducing the count numbers of metal elements on the test piece to a value of $1.0\times10^{11}$ atoms/cm$^2$ or lower.

The present invention has been explained referring to the preferred embodiments. However, the present invention is not limited to the illustrated embodiments which are given by way of examples only, and may be carried out in various modes without departing from the scope of the invention.

The invention claimed is:

1. A method of cleaning a ceramic susceptor comprising a face for mounting a semiconductor, the method comprising the steps of:
    applying a solution consisting of ethylenediaminetetraacetic acid and an organic acid to said susceptor; and
    forming a complex of ethylenediaminetetraacetic acid with at least one metal element on said susceptor to reduce the quantity of each of said metal elements other than a metal element or metal elements constituting a ceramic material of said ceramic susceptor to $1\times10^{11}$ atoms/cm$^2$ or lower.

2. The method of claim 1, further comprising the step of subjecting said susceptor to a blasting treatment before said applying step.

3. The method of claim 1, wherein said organic acid is a weak acid.

4. The method of claim 1, wherein said ceramic material comprises aluminum nitride.

* * * * *